(12) United States Patent
Hunt

(10) Patent No.: US 9,521,753 B1
(45) Date of Patent: Dec. 13, 2016

(54) VIBRATION DAMPING CIRCUIT CARD ASSEMBLY

(71) Applicant: The United States of America as Represented by the Administrator of the National Aeronautics and Space Administration, Washington, DC (US)

(72) Inventor: Ronald Allen Hunt, Huntsville, AL (US)

(73) Assignee: The United States of America as Represented by the Administrator of the National Aeronautics and Space Administration, Washington, DC (US)

( * ) Notice: Subject to any disclaimer, the term of this patent is extended or adjusted under 35 U.S.C. 154(b) by 120 days.

(21) Appl. No.: 14/196,203

(22) Filed: Mar. 4, 2014

(51) Int. Cl.
  *H05K 5/00* (2006.01)
  *H05K 7/14* (2006.01)
  *H05K 1/18* (2006.01)
  *B65B 5/08* (2006.01)
  *H05K 1/02* (2006.01)
  *G06F 15/16* (2006.01)
  *H02G 3/08* (2006.01)

(52) U.S. Cl.
  CPC . *H05K 1/18* (2013.01); *B65B 5/08* (2013.01); *G06F 15/161* (2013.01); *H02G 3/08* (2013.01); *H05K 1/02* (2013.01); *H05K 5/006* (2013.01); *H05K 5/0043* (2013.01); *H05K 7/1488* (2013.01)

(58) Field of Classification Search
  CPC ............ H05K 1/02; H05K 2201/09754; H05K 2201/0999; H05K 5/006; H05K 7/1488; H05K 5/0043; G06F 15/161; H02G 3/08; B60R 16/0239

USPC .......... 361/748, 752, 753, 796, 802; 174/50, 174/250, 377, 520, 559; 188/378, 379; 416/500; 267/136
  See application file for complete search history.

(56) References Cited

U.S. PATENT DOCUMENTS

| | | | |
|---|---|---|---|
| 5,136,470 | A | 8/1992 | Sheridon et al. |
| 6,547,049 | B1* | 4/2003 | Tomlinson ............. F01D 25/04 188/379 |
| 6,643,221 | B1 | 11/2003 | Hsu et al. |
| 7,461,728 | B2 | 12/2008 | Huston et al. |
| 8,985,935 | B2* | 3/2015 | Tan ........................ F16F 7/10 414/744.1 |
| 2003/0013322 | A1 | 1/2003 | Choy et al. |
| 2006/0180420 | A1 | 8/2006 | Rongong et al. |
| 2007/0068756 | A1* | 3/2007 | Huston .................. F16F 15/02 188/378 |

FOREIGN PATENT DOCUMENTS

CN 101576138 A 11/2009
JP 2003194142 A 7/2003

* cited by examiner

*Primary Examiner* — Binh Tran
(74) *Attorney, Agent, or Firm* — Peter J. Van Bergen; James J. McGroary

(57) ABSTRACT

A vibration damping circuit card assembly includes a populated circuit card having a mass M. A closed metal container is coupled to a surface of the populated circuit card at approximately a geometric center of the populated circuit card. Tungsten balls fill approximately 90% of the metal container with a collective mass of the tungsten balls being approximately (0.07) M.

7 Claims, 2 Drawing Sheets

VIBRATION DAMPING CIRCUIT CARD ASSEMBLY

ORIGIN OF THE INVENTION

The invention described herein was made in the performance of work under a NASA contract, and is subject to the provisions of Public Law 96-517 (35 U.S.C. §202) in which the Contractor has elected not to retain title.

BACKGROUND OF THE INVENTION

1. Field of the Invention

This invention relates to circuit card assemblies populated with components. More specifically, the invention is a circuit card assembly to include a particle damper for fundamental mode vibration damping.

2. Description of the Related Art

Circuit boards or cards are prone to mechanical-type failures as connections to their surface-mounted components experience fatigue/cracks when exposed to damaging vibration environments. Generally, component connection failures are due to the response of the primary bending mode of the circuit card when it is exposed to external excitations. The primary bending mode occurs at the card's fundamental frequency.

Attenuation of the primary bending mode response can be achieved by either increasing the stiffness of the circuit card or by providing damping mechanisms. An increase in the board stiffness increases the frequency and consequently decreases the resultant fatigue-related damage. However, increasing board stiffness involves increasing board thickness and/or inclusion of a small beam "stiffener" connected across the board as an additional constraint.

Vibration damping mechanisms directly attenuate the amplitude of the response at a particular mode without changing its frequency. Damping mechanisms/methods typically integrate a viscoelastic material into the board itself. However, board modifications to incorporate a viscoelastic material are generally not suitable for a board that has already been designed and built. The same is true of constrained-layer damping. Additionally, viscoelastic damping mechanisms are not very effective for frequencies greater than 50 Hz, are difficult to target at a specific mode, are very temperature dependent, and take up a lot of space.

SUMMARY OF THE INVENTION

Accordingly, it is an object of the present invention to provide a circuit card assembly having vibration damping features.

Another object of the present invention is to provide a method of equipping a circuit card assembly to damp the fundamental frequency of vibrations associated therewith.

Other objects and advantages of the present invention will become more obvious hereinafter in the specification and drawings.

In accordance with the present invention, a vibration damping circuit card assembly includes a populated circuit card having a mass M. A closed metal container is coupled to a surface of the populated circuit card at a region of the populated circuit card that includes a geometric center of the populated circuit card. Tungsten balls fill approximately 90% of the metal container. A mass of the tungsten balls is approximately (0.07)M.

BRIEF DESCRIPTION OF THE DRAWING(S)

Other objects, features and advantages of the present invention will become apparent upon reference to the following description of the preferred embodiments and to the drawings, wherein corresponding reference characters indicate corresponding parts throughout the several views of the drawings and wherein.

DESCRIPTION OF THE PREFERRED EMBODIMENT(S)

Figure 1:
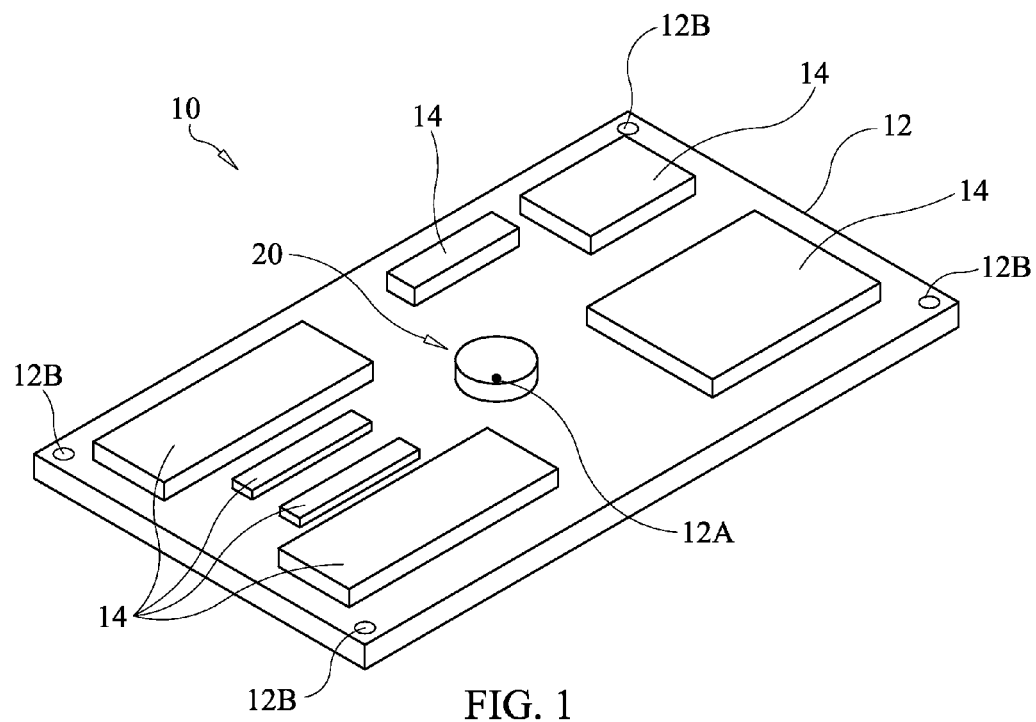
FIG. 1 is a perspective view of a vibration damping circuit card assembly in accordance with an embodiment of the present invention.

Referring now to the drawings and more particularly to FIG. 1, a perspective view of a populated circuit card assembly equipped for fundamental frequency damping in accordance with the present invention is shown and is referenced generally by numeral 10. In general, assembly 10 includes a conventional unpopulated circuit card or printed circuit board (PCB) 12, and a number of electronic components 14 (e.g., integrated circuit packages, individual components such as resistors, capacitors and inductors, etc.) mounted to/on the surface of PCB 12 or using through holes formed in PCB 12 as is well-known in the art. The choice, combinations, and/or number of components 14 are not limitations of the present invention. Components 14 are typically soldered in place on/to PCB 12 in ways well understood in the art. Locations of components 14 on PCB 12 are also not limitations of the present invention provided a geometric center 12A and small region thereabout are available for placement of a damping assembly 20 in accordance with the present invention. For purposes of the present invention, it will be assumed that assembly 10 will be supported in a structure (not shown) at a number of locations 12B (e.g., four are shown in the illustrated embodiment) that are distributed about geometric center 12A of PCB 12.

When PCB 12 populated with components 14 supported at locations 12B is subject to random vibrations, the assembly will vibrate in a direction substantially normal to the planar surfaces of PCB 12. As mentioned above, the primary bending mode occurs at the fundamental frequency associated with the assembly. At the primary bending mode, component-to-PCB connections (i.e., solder points) experience their greatest fatigue and crack failure. The present invention provides for attenuation of the fundamental frequency vibrations by means of damping assembly 20.

Figure 2:
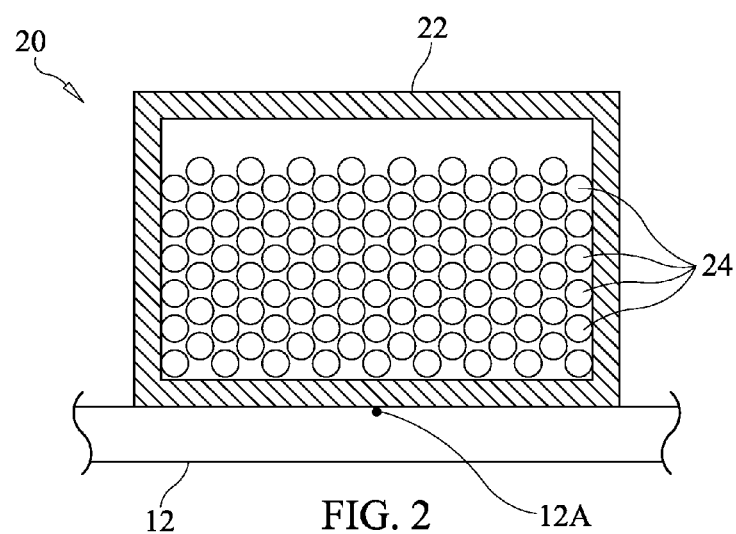
FIG. 2 is an isolated cross-sectional view of a metal container filled with tungsten balls for vibration damping in accordance with the present invention.

In general, damping assembly 20 is a container filled with individual uncoupled balls to define a particle impact damper. More specifically, and with reference to FIG. 2, damping assembly 20 includes a closed metal container 22 whose volume is approximately 90% filled with solid tungsten balls 24. As mentioned above, damping assembly 20 is located at (e.g., centered or almost centered on) geometric center 12A of PCB 12 since this is where PCB 12 will experience maximum deflection during the primary bending mode. By being made from metal, container 22 serves as a Faraday cage. Suitable metals include aluminum and steel. Tungsten balls 24 can be the same size, substantially the same size, or different sizes without departing from the scope of the present invention. Tungsten balls 24 can be selected from commercially-available sizes (e.g., 0.085 inch shot) or be custom-sized without departing from the scope of the present invention. The "approximately 90%" filling of container 22 with tungsten balls 24 provides for slight collective movement of tungsten balls 24 during vibration of assembly 10.

To effectively damp out vibrations at the fundamental frequency of a particular assembly 10 and thereby reduce or eliminate the response of primary bending mode, the collective mass of tungsten balls 24 should be a small percentage of the mass of PCB 12 and components 14. More specifically, for fundamental frequency damping, the mass of all tungsten balls 24 is approximately 7% of the mass of the combination of PCB 12 and components 14.

Figure 3:
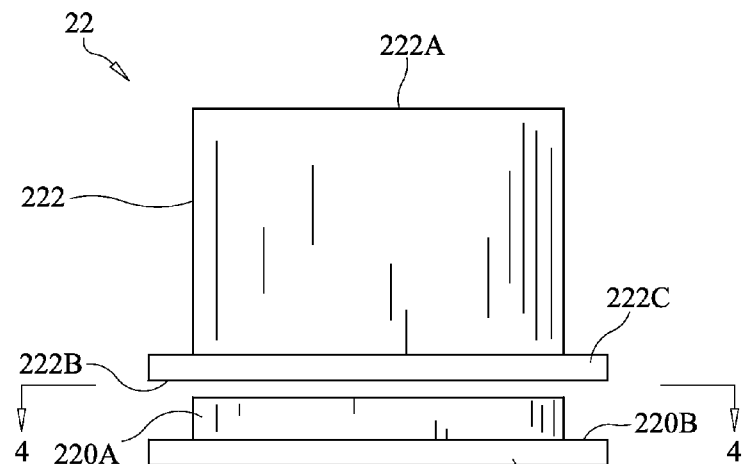
FIG. 3 is an isolated exploded view of an exemplary metal container prior to the assembly thereof.
Figure 4:
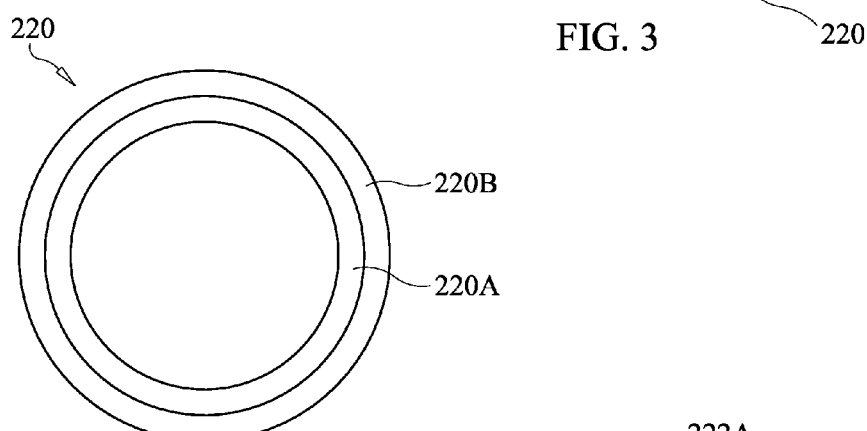
FIG. 4 is a plan view of the container's base taken along line 4-4 in FIG. 3.
Figure 5:
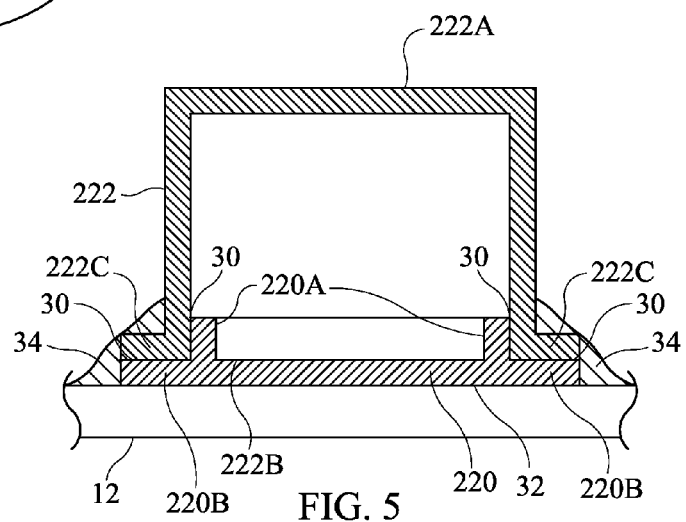
FIG. 5 is a cross-sectional view of the assembled metal container bonded to a populated circuit card in accordance with an embodiment of the present invention.

Metal container 22 can be a closed cylinder as this shape minimizes container mass for a given volume. An exemplary construction for metal container 22 is illustrated in FIGS. 3-5 where the tungsten balls have been omitted in FIG. 5 for clarity of illustration. Prior to being filled with the tungsten balls in accordance with the present invention, metal container 22 is a two-piece assembly (FIG. 3) defined by a circular base 220 and a cylindrical housing 222 that is closed on one end 222A and open on its other end 222B. Open end 222B terminates in an annular flange 222C extending radially outward from open end 222B. Circular base 220 defines an annular ridge 220A sized to slidingly engage the inside walls of open end 222B. Circular base 220 also defines an annular flange 220B extending radially outward from annular ridge 220A.

After housing 222 is approximately 90% filled with the tungsten balls described above, base 220 and housing 222 are joined/bonded together to form the closed metal container shown in FIG. 5. More specifically, an adhesive 30 is disposed between (i) the inside walls of open end 222B and annular ridge 220A, and (ii) annular flange 222C and annular flange 220B. This construction allows metal container 22 to carry shear loads. The exposed planar surface of base 220 is adhered to PCB 12 by adhesive 32. A continuous fillet of adhesive 34 is applied to annular flange 222C and a portion of PCB 12 disposed about annular flange 222C for additional mechanical support of damping assembly 20.

The advantages of the present invention are numerous. The vibration damping circuit card assembly was shown to reduce the measured peak acceleration response at the assembly's fundamental frequency by an order of magnitude. Analysis showed that the beneficial damping effect was experienced across the populated circuit card. The present invention can be incorporated into current circuit and assembly design and could be used to modify existing circuit assemblies.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A vibration damping circuit card assembly, comprising:
   a populated circuit card having a mass M;
   a closed metal container coupled to a surface of said populated circuit card at a region of said populated circuit card that includes a geometric center of said populated circuit card, said closed metal container including
   a base having a planar surface bonded to said surface of said populated circuit card, said base having a continuous ridge extending away therefrom wherein an annular flange is defined adjacent said continuous ridge,
   a housing having an open end that is in sliding engagement with said continuous ridge, said housing having a continuous flange defined about said open end for engagement with said annular flange, and
   an adhesive disposed between said open end of said housing and said continuous ridge, said adhesive also disposed between said continuous flange and said annular flange; and
   tungsten balls filling approximately 90% of said metal container, wherein a mass of said tungsten balls is approximately (0.07)M.

2. A vibration damping circuit card assembly as in claim 1, wherein said closed metal container is made from a metal selected from the group consisting of aluminum and steel.

3. A vibration damping circuit card assembly as in claim 1, wherein said closed metal container is cylindrical.

4. A vibration damping circuit card assembly as in claim 1, further comprising a continuous fillet of adhesive disposed on said continuous flange and a portion of said populated circuit card disposed about said continuous flange.

5. A vibration damping circuit card assembly, comprising:
   a populated circuit card having a mass M, said populated circuit card having a geometric center and defining a plurality of support locations distributed about said geometric center;
   a closed metal cylinder coupled to a surface of said populated circuit card at a region of said populated circuit card that includes said geometric center thereof, said closed metal cylinder including
   a base having a planar surface bonded to said surface of said populated circuit card, said base having a circular ridge extending away therefrom wherein an annular flange is defined adjacent said circular ridge,
   a cylindrical housing having a closed end and having an open end that is in sliding engagement with said circular ridge, said cylindrical housing having a continuous flange defined about said open end for engagement with said annular flange, and
   an adhesive disposed between said open end of said cylindrical housing and said circular ridge, said adhesive also disposed between said continuous flange and said annular flange; and
   solid tungsten balls filling approximately 90% of said metal container, wherein a collective mass of said solid tungsten balls is approximately (0.07)M.

6. A vibration damping circuit card assembly as in claim 5, wherein said closed metal cylinder is made from a metal selected from the group consisting of aluminum and steel.

7. A vibration damping circuit card assembly as in claim 5, further comprising a continuous fillet of adhesive disposed on said continuous flange and a portion of said populated circuit card disposed about said continuous flange.

\* \* \* \* \*